United States Patent
Pun et al.

(10) Patent No.: US 10,917,973 B1
(45) Date of Patent: Feb. 9, 2021

(54) METHOD OF DIRECT EMBEDDING A LITHIUM ION BATTERY ON A FLEXIBLE PRINTED CIRCUIT BOARD

(71) Applicant: Compass Technology Company Limited, Shatin (HK)

(72) Inventors: Kelvin Po Leung Pun, Shatin (HK); Chee Wah Cheung, Kowloon (HK); Jason Rotanson, Kowloon (HK); Wing Lung Hon, Shatin (HK); Yam Chong, Shatin (HK); Wai Yin Wong, Shatin (HK); Shengbo Lu, Shatin (HK); Chenmin Liu, Shatin (HK)

(73) Assignee: Compass Technology Company Limited, Shatin (HK)

( * ) Notice: Subject to any disclaimer, the term of this patent is extended or adjusted under 35 U.S.C. 154(b) by 0 days.

(21) Appl. No.: 16/801,779

(22) Filed: Feb. 26, 2020

(51) Int. Cl.
*H05K 1/18* (2006.01)
*H05K 1/09* (2006.01)
*H05K 3/28* (2006.01)
*H01M 10/0525* (2010.01)
*H01M 4/139* (2010.01)

(52) U.S. Cl.
CPC ............ *H05K 1/181* (2013.01); *H01M 4/139* (2013.01); *H01M 10/0525* (2013.01); *H05K 1/09* (2013.01); *H05K 1/189* (2013.01); *H05K 3/284* (2013.01); *H05K 2201/10037* (2013.01)

(58) Field of Classification Search
CPC .......... H05K 1/181; H05K 1/09; H05K 1/189; H05K 3/284; H05K 2201/10037; H01M 10/0525; H01M 4/139
See application file for complete search history.

(56) References Cited

U.S. PATENT DOCUMENTS

| | | | | |
|---|---|---|---|---|
| 5,993,248 A | * | 11/1999 | Bethurum | H01M 2/1044 439/500 |
| 6,108,211 A | * | 8/2000 | Diessner | H01R 12/62 200/512 |
| 6,162,345 A | * | 12/2000 | Kinard | C25D 11/26 205/318 |
| 2013/0004826 A1 | * | 1/2013 | Li | H01M 4/366 429/144 |

(Continued)

OTHER PUBLICATIONS

Relative Permittivity Dielectric Constant, Engineeringtoolbox (Year: 2020).*

*Primary Examiner* — Steven T Sawyer
(74) *Attorney, Agent, or Firm* — Saile Ackerman LLC; Stephen B. Ackerman; Rosemary L. S. Pike

(57) ABSTRACT

A flexible printed circuit board with a lithium ion battery printed thereon is achieved. The flexible printed circuit board comprises a top and a bottom electrically insulating base film, a top electrically conductive metal layer over the top electrically insulating base film, and a bottom electrically conductive metal layer under the bottom electrically insulating base film. A printable lithium ion battery sits in a cavity completely through the top and bottom base films wherein a top of the battery contacts the top electrically conductive metal layer and wherein a bottom of the battery contacts the bottom electrically conductive metal layer. An adhesive film around the battery seals it to the top and bottom electrically insulating base film and seals the top electrically conductive metal layer to the bottom electrically conductive metal layer.

13 Claims, 3 Drawing Sheets

(56) References Cited

U.S. PATENT DOCUMENTS

| | | |
|---|---|---|
| 2013/0266847 A1* | 10/2013 | Noguchi ............. H01M 10/056 |
| | | 429/163 |
| 2015/0280221 A1* | 10/2015 | Abdelsalam ............ H01M 4/64 |
| | | 429/217 |
| 2016/0329569 A1* | 11/2016 | Chen ................... H01M 2/1673 |
| 2016/0336552 A1* | 11/2016 | MacLean ............ H01M 2/0287 |
| 2017/0179517 A1* | 6/2017 | Stalder ................... H01M 2/08 |
| 2019/0104613 A1* | 4/2019 | Zargar ............... G06K 19/0717 |
| 2019/0252690 A1 | 8/2019 | Miles et al. |
| 2019/0273280 A1* | 9/2019 | Pun .................. H01M 10/0436 |
| 2019/0334168 A1 | 10/2019 | Durstock et al. |
| 2019/0341613 A1 | 11/2019 | Lee et al. |
| 2019/0355239 A1 | 11/2019 | Brinkley et al. |

\* cited by examiner

METHOD OF DIRECT EMBEDDING A LITHIUM ION BATTERY ON A FLEXIBLE PRINTED CIRCUIT BOARD

TECHNICAL FIELD

This application relates to integrated circuit boards, and more particularly, to embedding a lithium ion battery on flexible printed circuit boards.

BACKGROUND

With the emergence of Internet of Things (IoTs) and 5G networking technologies, more and more devices are being interconnected to communicate with each other to make decisions and improve people's lives. Future generations of devices are expected to possess attributes such as low cost, small form factor, high reliability, flexible/conformable, and low power consumption. Flexible electronics have become ubiquitous in fulfilling the aforementioned challenges. In particular, System in Package (SiP) architecture is the packaging technology of choice for high level of device integration such as antennas, microprocessors, and sensors, as well as batteries to enable self-powered devices.

A battery is an essential component to power portable electronic devices. Conventionally electronic devices have been using commercial batteries such as prismatic, cylindrical, and coin cells. These batteries are not suitable to power flexible electronics due to their bulkiness, rigidity, and safety concerns. Power sources for flexible electronic devices should also conform to the devices' requirements such as ultra-thin, ultra-light, mechanical conformity, and safety under mechanical loading.

Integrating a flexible battery directly onto a flexible substrate is an attractive solution to future generations of devices. It offers many advantages such as reduced form factor, reduced cost, and process simplification. The integrated flexible battery can be used for applications requiring power management and RF (radio frequency) communication such as a smart card, wearable devices, and internet of things (IoTs).

Various U.S. Patent Applications disclose flexible or printable batteries including U.S. Patent Applications 2019/0273280 (Pun et al), 2019/0252690 (Miles et al), 2019/0334168 (Durstock et al), 2019/0341613 (Lee et al) and 2019/0355239 (Brinkley et al).

SUMMARY

A principal object of the present disclosure is to provide a method of embedding a lithium ion battery on a flexible printed circuit board.

Another object of the disclosure is to provide a flexible printed circuit board with a lithium ion battery printed thereon.

A further object of the disclosure is to provide a self-powered flexible circuit board package.

According to the objects of the disclosure, a flexible printed circuit board with a lithium ion battery printed thereon is achieved. The flexible printed circuit board comprises a top and a bottom electrically insulating base film, a top electrically conductive metal layer over the top electrically insulating base film, and a bottom electrically conductive metal layer under the bottom electrically insulating base film. A printable lithium ion battery sits in a cavity completely through the top and bottom base films wherein a top of the battery contacts the top electrically conductive metal layer and wherein a bottom of the battery contacts the bottom electrically conductive metal layer. An adhesive film around the battery seals it to the top and bottom electrically insulating base film and seals the top electrically conductive metal layer to the bottom electrically conductive metal layer.

Also according to the objects of the disclosure, a method of fabricating an electrochemical lithium ion battery in between top and bottom layers of encapsulation is achieved. An encapsulation is provided on a flexible printed circuit board, the encapsulation comprising top and bottom electrically insulating base films, a top electrically conductive metal layer over the top electrically insulating base film, and a bottom electrically conductive metal layer under the bottom electrically insulating base film. An anode is fabricated on the bottom metal layer of the encapsulation and the anode is electrically connected directly through an electrical conductive metal trace to at least one integrated circuit chip mounted on the flexible printed circuit board as a negative terminal allowing electrons to flow out of the anode. A lithium-metal-oxide cathode is fabricated on an aluminum layer, the aluminum layer electrically connected to the top metal layer of the encapsulation. The cathode is electrically connected directly through an electrical conductive metal trace to the at least one integrated circuit chip mounted on the flexible printed circuit board as a positive terminal allowing electrons to flow into the cathode. A UV-curable composite solid electrolyte is fabricated between the anode and the cathode. An adhesive film around the battery seals it to the top and bottom electrically insulating base film and seals the top electrically conductive metal layer to the bottom electrically conductive metal layer.

Also in accordance with the objects of the disclosure, a method of fabricating a self-powered flexible circuit board package is achieved. A flexible printed circuit board with a printed lithium ion battery is provided comprising a top and a bottom electrically insulating base film, a top electrically conductive metal layer over the top electrically insulating base film, and a bottom electrically conductive metal layer under the bottom electrically insulating base film. A printable lithium ion battery sits in a cavity completely through the top and bottom base films wherein a top of the battery contacts the top electrically conductive metal layer and wherein a bottom of the battery contacts the bottom electrically conductive metal layer. An adhesive film around the battery seals it to the top and bottom electrically insulating base film and seals the top electrically conductive metal layer to the bottom electrically conductive metal layer. A plurality of active and passive electronic devices are mounted on top of copper traces wherein at least one of the active devices is connected to and powered by the printed lithium ion battery. The active devices can be integrated circuits (IC) with different functionalities such as RF (Radio Frequency) IC, memory chips, logic IC, converter IC, power management IC, application specific IC (ASIC), microcontroller unit (MCU), display driver IC, touch driver IC, touch and display drive integration (TDDI) IC, biometrics sensor & controller IC, etc.

BRIEF DESCRIPTION OF THE DRAWINGS

In the accompanying drawings forming a material part of this description, there is shown.

DESCRIPTION OF THE PREFERRED EMBODIMENTS

The present disclosure describes flexible printed circuit boards with flexible lithium ion batteries directly printed onto them. Flexible electronics have a small form factor. They typically have a high routing density and are foldable and bendable.

Figure 1:
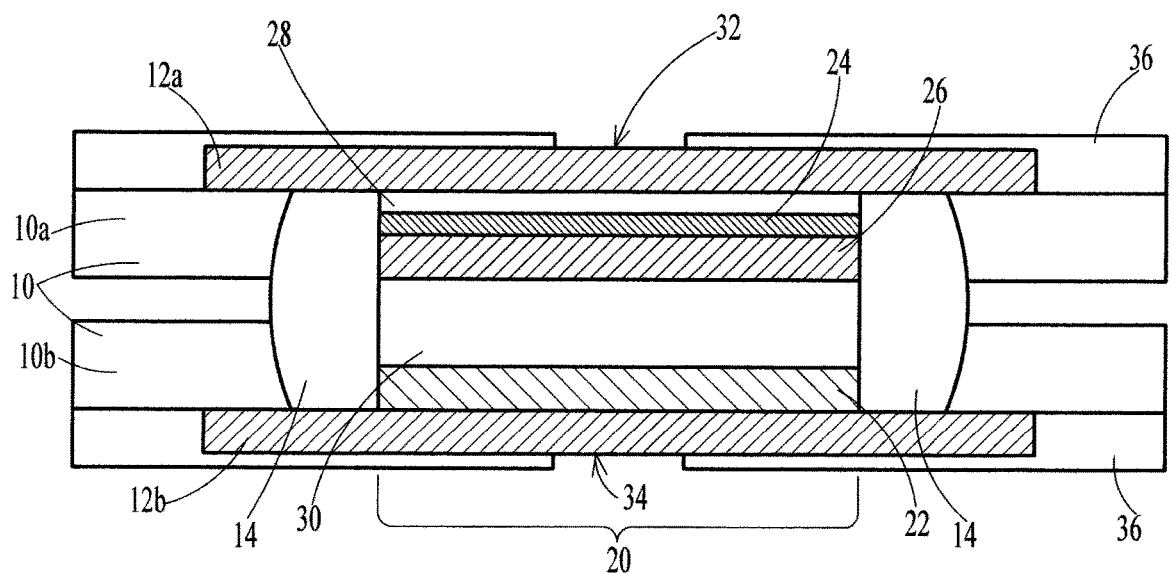
FIG. 1 is a cross-sectional representation of a preferred embodiment of the present disclosure.

Referring now more particularly to FIG. 1, there is shown a portion of a cross-section of a flexible printed circuit board with printed lithium ion battery therein.

Stacked layers 10a and 10b on top and bottom, respectively, of the flexible printed circuit board (PCB) are electrically insulating base films. The base film can be polyimide (PI), liquid crystal polymer (LCP), Cyclo olefin polymer (COP), polyester (PET), polyethylene-naphtalate (PEN), poly tetra fluoro ethylene, or a laminate substrate such as epoxies and BT, or Teflon, or modified Teflon with a thickness of between about 10 and 50 µm.

Electrically conductive metal layers 12a and 12b are stacked over the top base layer 10a and under the bottom base layer 10b, respectively. The metal layers can be copper having a thickness of between about 5 and 50 µm. A surface finishing layer is included on the metal layer to provide printability and resistance against oxidation. The surface finishing layer may be nickel, palladium, gold, tin, silver, aluminum, and ruthenium or a combination of thereof.

Cavities are cut into the stacked layers 10a and 10b, for example, by laser drilling or hard tool punching, until the metal layers 12a and 12b, respectively, are exposed. An adhesive film 14 is cut, for example by laser cutting or hard tool punching, to form an opening all the way through the center of the film. The cut adhesive film 14 is then laminated onto the bottom side metal layer 12b within the cavity, exposing the bottom metal layer 12b within the center opening. Battery layers are printed onto the substrate within the cavities.

The flexible substrate is folded and laminated together with the battery enclosed between the two sides of the folded substrate 10a and 10b.

The battery 20 is encapsulated by electrically insulating base film 10a and 10b on the outside horizontal edges of the battery and by conductive metal layers 12a and 12b with surface finishing layers on the top and bottom of the battery. This encapsulation provides high resistance from water and oxygen. The combination of the electrically insulating base film and the metal layer have a water vapor absorption rate no higher than $1 \times 10^{-3}$ g m$^{-2}$ per day.

The adhesive film 14 between the top and bottom conductive layers 12a and 12b seals the layers together and provides insulation for the battery cathode, anode, and electrolyte. The adhesive film comprises insulating polymer composite adhesives containing acrylic, cast polypropylene, epoxy, polyurethane or a combination of the above surrounding the perimeter of the battery. The adhesive film should have a dielectric constant less than 3 at a frequency of 10 GHz. If a thermosetting adhesive is used, it should have a curing temperature in the range of 150 to 200° C. and should have a peeling strength of no less than 1 N/mm with Cu metal, for example, and the electrically insulating base film.

The top and bottom metal layers 12a and 12b work as current collectors and positive/negative terminals of the battery 20 by connecting with electrical conductive metal traces of the positive and negative terminals, respectively, of the flexible printed circuit board. No external connection or electrical contact is needed to connect the flexible printed circuit board and the battery.

The battery 20 between the top and bottom metal layers 12a and 12b of the encapsulation includes an anode 22 fabricated on the bottom metal layer 12b of the encapsulation. Protective layer 36 is an electrically insulative layer (e.g. solder resist, coverlay) that is commonly used in printed circuit board technology to prevent electrical shorts and to provide mechanical protection on the current collector and copper trace 12a, 12b.

Figure 6:
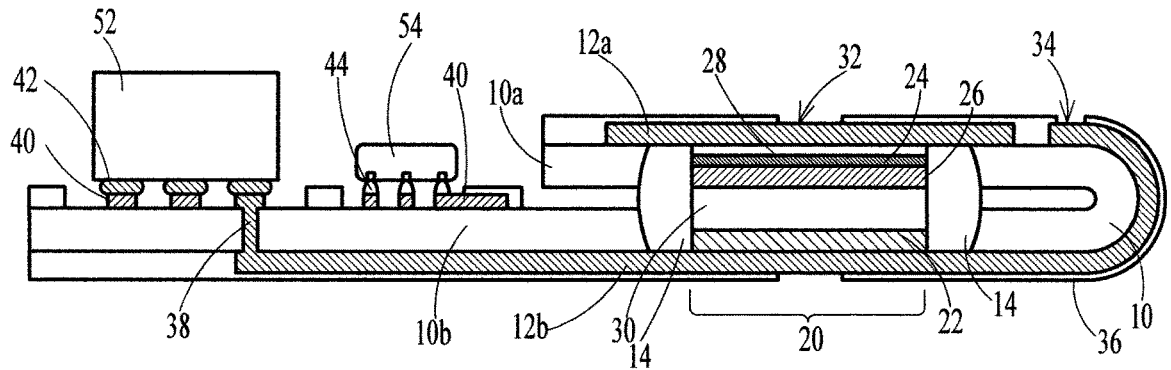
FIG. 6 is a cross-sectional representation of a completed preferred embodiment of the present disclosure.

The anode 22 is electrically connected directly through an electrical conductive metal trace to the integrated circuit chips mounted on the flexible printed circuit board as a negative terminal 34 allowing electrons to flow out of the anode. For example, an integrated circuit chip 52 is illustrated in FIG. 6 connected by metal trace 12b to the anode 22.

The anode 22 comprises an artificial graphite in an amount of 85-90% by weight, a carbon conductive agent of Super P and KS6 in an amount of 1-8% and 1-6%, respectively, and a polyvinylidene fluoride polymer binder in an amount of 1-2%. Other anode active materials such as silicon carbon composite, graphene oxide, natural graphite, or mixtures thereof may also be used. Table 1 provides an example of anode slurry formulation.

TABLE 1

| Solvent<br>Component | N-Methyl-2-pyrrolidone<br>Weight percentage (%) |
|---|---|
| Graphite | 85.00% |
| Super P | 7.89% |
| Conductive Graphite KS6 | 5.53% |
| Polyvinylidene fluoride (MW 600000) | 1.58% |
| Total | 100% |

Figure 7:
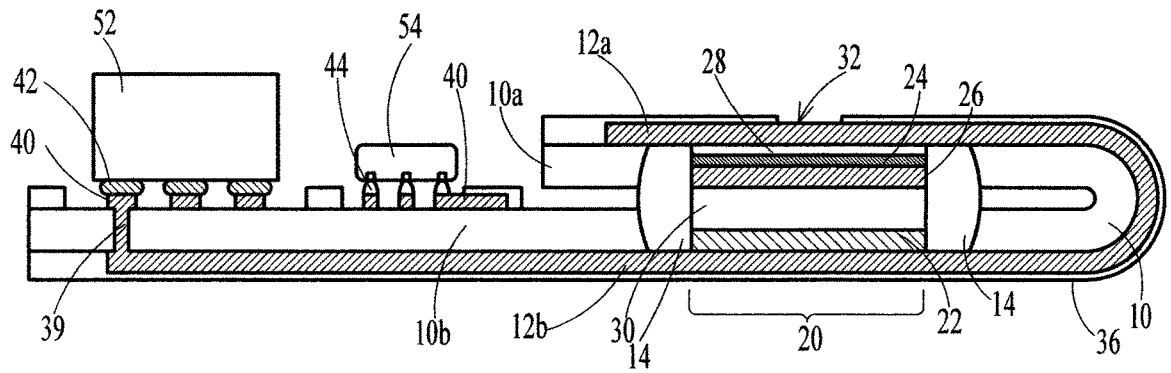
FIG. 7 is another cross-sectional representation of a completed preferred embodiment of the present disclosure.

A lithium metal oxide cathode 26 is fabricated on an aluminum layer 24. The aluminum layer 24 is electrically connected to the metal layer 12a of the encapsulation through conductive adhesive 28. The metal layer 12a is electrically connected directly through an electrical conductive metal trace to the integrated circuit chips mounted on the flexible printed circuit board as a positive terminal 32 allowing electrons to flow into the cathode. An example of the connection of the terminal 32 with the die 52 is illustrated in FIG. 7.

The lithium-metal-oxide cathode 26 comprises a lithium metal oxide such as $LiNi_xCo_yMn_zO_2$, $LiNi_xCo_yAl_zO_2$, $LiCoO_2$, $xLi_2MnO_3 \cdot (1-x)LiMO_2$ (M=Mn, Ni, Co), $LiMPO_4$ (M=Fe and/or Mn), or $LiMn_2O_4$ in an amount of 80-98%, a carbon conductive agent of Super P and KS6 in an amount of 1-5% and 1-5%, respectively, and a polyvinylidene fluoride polymer binder in an amount of 1-10%. Table 2 provides an example of cathode slurry formulation.

TABLE 2

| Solvent | N-Methyl-2-pyrrolidone |
|---|---|
| Component | Weight percentage (%) |
| NCM 811 | 89.00% |
| Super P | 3.00% |
| Conductive graphite KS6 | 2.00% |
| Polyvinylidene fluoride (MW 600000) | 6.00% |
| Total | 100% |

A UV-curable composite solid electrolyte 30 is fabricated on either side of the anode and cathode electrodes 22 and 26 and is cured by UV light with a wavelength in the range of 200-400 nm within 1 minute. The UV-curable composite solid electrolyte 30 has a room temperature ionic conductivity of no less than $1\times10^{-4}$ S/cm after curing. As opposed to a liquid state electrolyte, the solid electrolyte of the present disclosure improves the battery safety significantly as no leakage/flow occurs in the solid state.

The UV-curable composite solid electrolyte comprises a lithium ion-conducting $LiPF_6$ based liquid electrolyte in an amount from 75-85% by weight, a lithium ion conducting Polyethylene oxide polymer in an amount from 2-5% by weight, a Poly(vinylidene fluoride-co-hexafluoropropylene) in an amount from 1-5% by weight, an Aluminium oxide ceramic filler in an amount from 2-5% by weight, an Acetonitrile solvent in an amount from 5-10% by weight, a Trimethyopropane ethoxylate monomer as polymer host in an amount from 2-5% by weight, and a 2-Hydroxy-2-methylpropiophenone photo initiator in an amount from 0.01-1% by weight. Table 3 provides an example of a composite electrolyte formulation.

TABLE 3

| Component | Weight percentage (%) |
|---|---|
| $LiPF_6$ liquid electrolyte | 75-85% |
| Polyethylene oxide | 2-5% |
| Poly(vinylidene fluoride-co-hexafluoropropylene) | 1-5% |
| Aluminum oxide | 2-5% |
| Acetonitrile | 5-10% |
| Trimethyopropane ethoxylate | 2-5% |
| 2-Hydroxy-2-methylpropiophenone | 0.01-1% |
| Total | 100% |

The electrochemical battery of the present disclosure has an aerial capacity density of no less than 1.5 $mAh/cm^2$ and is capable of being cycled at a rate of no less than 0.2 C. C-rate is a term commonly used in the field of batteries to denote the discharge relative to its maximum capacity; in this case, 0.2 C means the battery is operating at 20% capacity.

Figure 2:
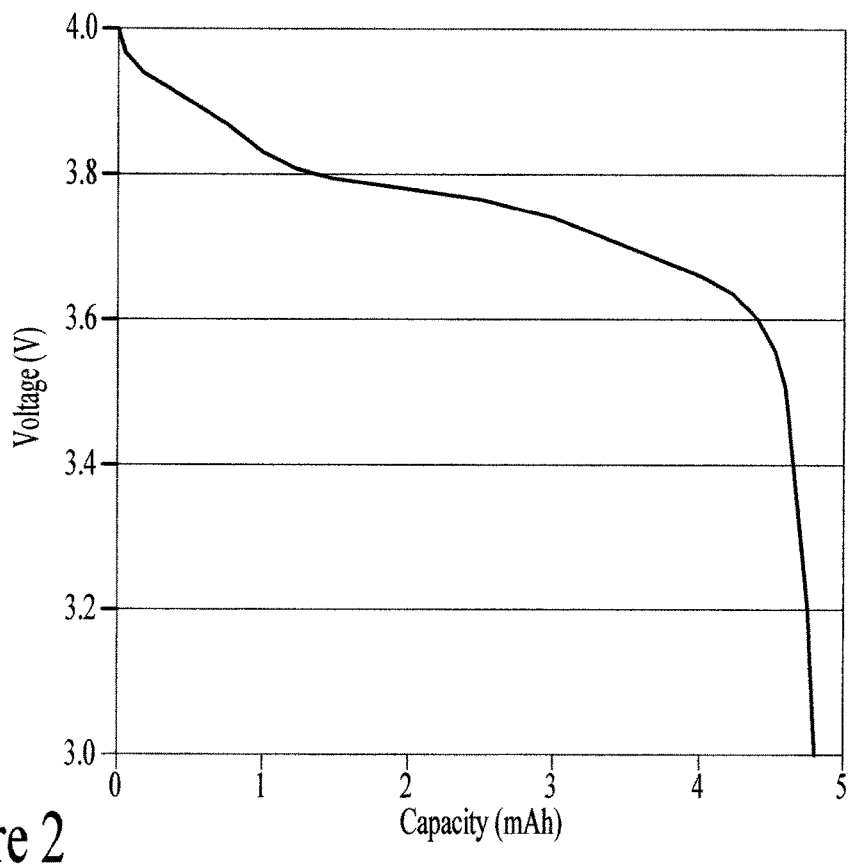
FIG. 2 is a graphical representation of the discharging curve and the corresponding nominal voltage of a preferred embodiment of the present disclosure.

FIG. 2 is the discharging curve at an operation voltage in the range of 3V-4V, which indicates the nominal voltage of the battery is 3.7V based on the calculated mean value of the voltage.

Figure 3:
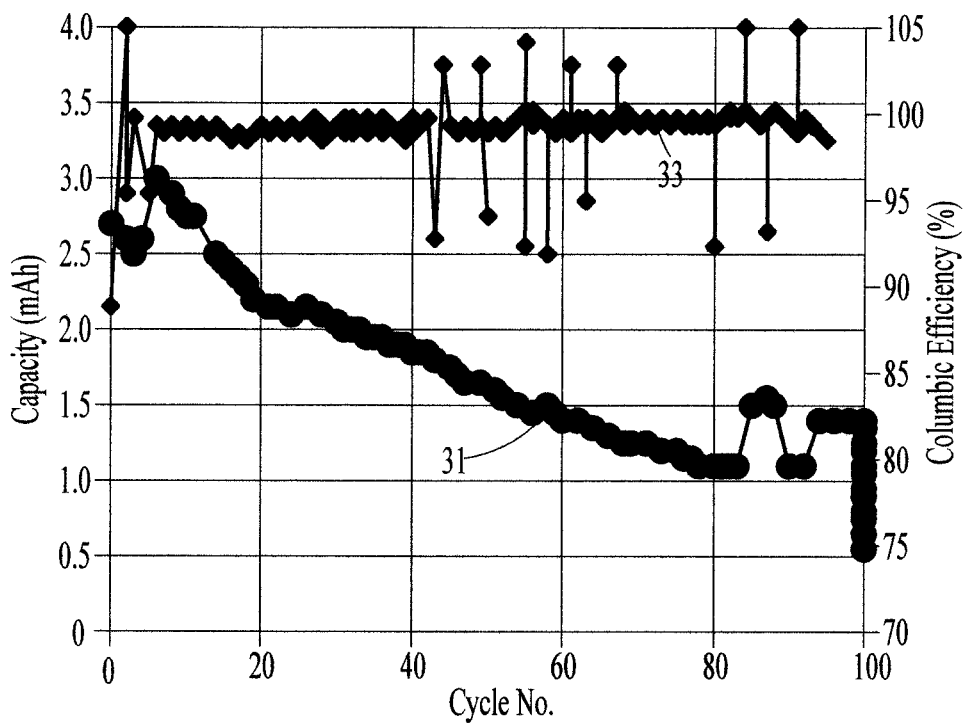
FIG. 3 is a graphical representation of a cycling test of a preferred embodiment of the present disclosure.

FIG. 3 illustrates the capacity of the battery of the present disclosure as a function of number of cycles run (31) and Columbic efficiency (%) as a function of number of cycles (33). This graph shows that the battery of the present disclosure has a cycle life of more than 100 cycles at 0.2 C charge (20% capacity) and discharge.

Figure 4:
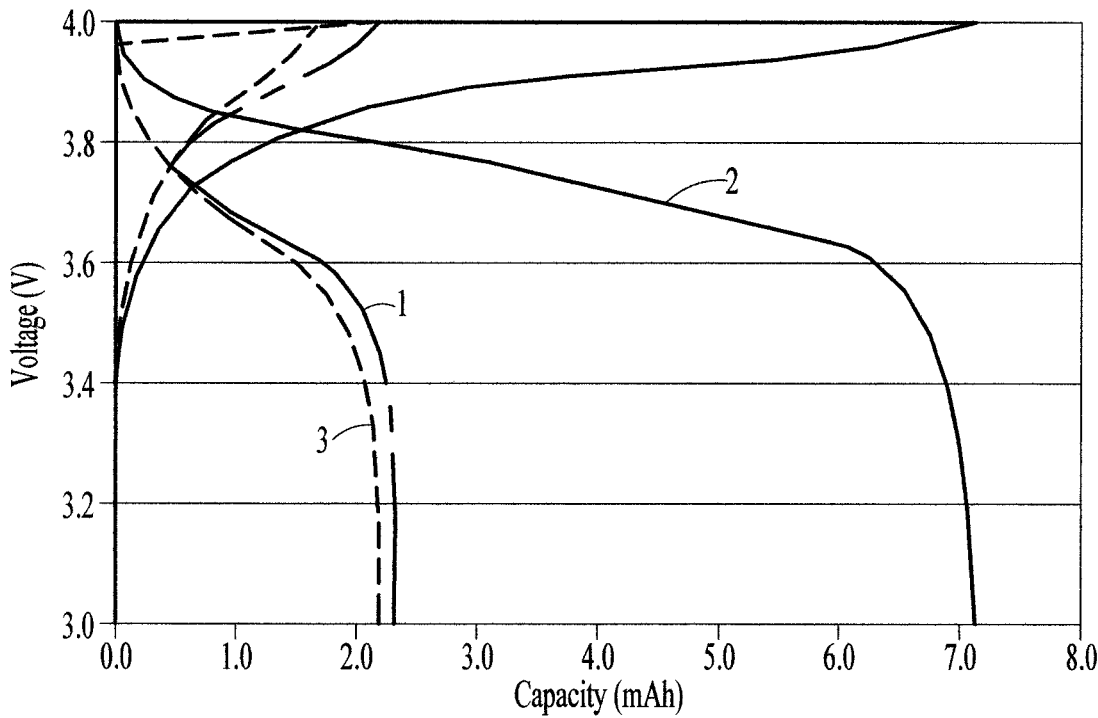
FIG. 4 is a graphical representation of a high temperature test of a preferred embodiment of the present disclosure.

A high temperature test was performed as shown in Table 4 and in FIG. 4.

TABLE 4

| Test | Temperature | Capacity | Impedance |
|---|---|---|---|
| 1 | Room temperature before high temperature | 2.39 mAh | 5.3 Ω |
| 2 | 60° C. | 7.01 mAh (293.3%) | 4.41 Ω |
| 3 | Room temperature after high temperature | 2.21 mAh | 5.46 Ω |

FIG. 4 illustrates voltage as a function of capacity for the three temperatures in Table 4. This figure shows that the battery of the present disclosure can be operated at a high temperature of 60° C. with an increased capacity relative to room temperature capacity. Preferably, the battery of the present disclosure can be operated at a temperature of about 20° C. (room temperature) up to 70° C.

Figure 5:
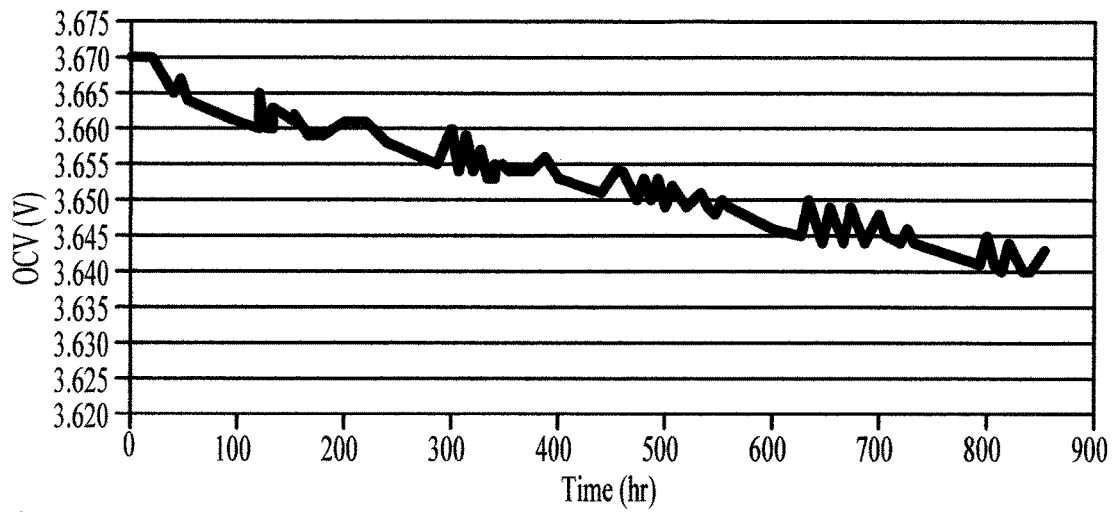
FIG. 5 is a graphical representation of a self-discharge test of a preferred embodiment of the present disclosure.

A self-discharge test was performed as shown in Table 5 and FIG. 5. K-value is the average voltage drop rate in the self-discharge test; that is, the difference between initial and last open circuit voltage (OCV) divided by total time.

TABLE 5

| Initial OCV | Last OCV | $V_0$-$V_{last}$ | Hour | K-Value | OCV % change |
|---|---|---|---|---|---|
| 3.653554 V | 3.643167 V | 28.336 mV | 846 | 0.03346 mV/h | −0.77% |

FIG. 5 illustrates open circuit voltage (OCV) as a function of time in hours at an operation voltage range of 3V-4V, which indicates the nominal voltage of the battery is 3.7V based on the calculated mean value of the voltage. These results show that the battery of the present disclosure has a low self-discharge rate of no more than 2% drop of the open circuit voltage per month. Preferably the battery of the present disclosure has a working range of between about 2.5 V to 4.2 V.

FIG. 6 provides an example of a self-powered flexible circuit board package including a flexible printed circuit board 10 with a printed lithium ion battery 20. First terminal 32 is connected to top current collector 12a and cathode 26. Second terminal 34 is connected to bottom current collector 12b connected to anode 22. Electronic devices (active and passive) are mounted on top of copper traces 12a and/or 12b. As shown, for example, in FIG. 6, integrated circuit die 52 is mounted on the PCB by gold bumps 42 on copper traces 40 and connected by via 38 and metal trace 12b to second terminal 34. Component 54, for example, is illustrated mounted by solder 44 onto copper traces 40.

FIG. 7 is another view of the flexible printed circuit board 10 with printed lithium ion battery 20 showing integrated circuit die 52 connected by via 39 and metal trace 12b to first terminal 32.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A flexible printed circuit board with a printable lithium ion battery directly printed thereon, comprising
   a top and a bottom electrically insulating base film;
   a top electrically conductive metal layer over said top electrically insulating base film and a bottom electrically conductive metal layer under said bottom electrically insulating base film, a printable lithium ion battery in a cavity completely through said top and bottom base films wherein a top of said battery contacts said top electrically conductive metal layer and wherein a bottom of said battery contacts said bottom electrically conductive metal layer and wherein said lithium ion battery comprises:
an anode at said bottom of said battery,
an aluminum layer at said top of said battery;
a cathode underlying said aluminum layer; and
a solid state electrolyte between said anode and said cathode, wherein said aluminum layer is electrically connected to said top electrically conductive metal layer by a conductive adhesive; and
an adhesive film around said battery sealing it to said top and bottom electrically insulating base film and sealing said top electrically conductive metal layer to said bottom electrically conductive metal layer.

2. The flexible printed circuit board according to claim 1 wherein said top and bottom electrically insulating base films comprise two portions of a same said flexible printed circuit board, said top electrically insulating base film folded over said bottom electrically insulating base film with said printable lithium ion battery therebetween.

3. The flexible printed circuit board according to claim 1, further comprising surface finishing on said top and bottom electrically conductive metal layers to provide high resistance to water and oxygen wherein said surface finishing comprises nickel, palladium, gold, tin, silver, aluminum, or ruthenium or a combination of thereof.

4. The flexible printed circuit board according to claim 1, wherein said top and bottom base film comprises polyimide (PI), liquid crystal polymer (LCP), Cyclo-olefin polymer (COP), polyester (PET), polyethylene-naphtalate (PEN), poly tetra fluoro ethylene, or laminate substrate such as epoxies and BT, or Teflon, or modified Teflon having a thickness of between about 10 and 50 μm.

5. The flexible printed circuit board according to claim 1, wherein said top and bottom metal layers comprise copper having a thickness of between about 5 and 50 μm.

6. The flexible printed circuit board according to claim 3, wherein the combination of electrically insulating base film and metal layer with surface finishing has a water vapor absorption rate no higher than $1 \times 10^{-3}$ g m$^{-2}$ per day.

7. The flexible printed circuit board according to claim 1, wherein said top and bottom metal layers work as current collectors and positive and negative terminals of said battery by connecting with electrical conductive metal traces of said positive and negative terminals.

8. The flexible printed circuit board according to claim 1 wherein no external connection or electrical contact is needed to connect said flexible printed circuit board and said battery.

9. The flexible printed circuit board according to claim 1, wherein said adhesive film comprises insulating polymer composite adhesives containing acrylic, cast polypropylene, epoxy, or polyurethane or a combination.

10. The flexible printed circuit board according to claim 9, wherein said insulating polymer composite adhesive has a dielectric constant less than 3 at a frequency of 10 GHz.

11. The flexible printed circuit board according to claim 9, wherein said insulating polymer composite adhesive comprises a thermosetting adhesive having a curing temperature between about 150 and 200° C. and a peeling strength of no less than 1 N/mm with respect to said top and bottom metal layers and said top and bottom base film.

12. A method of fabricating a self-powered flexible circuit board package comprising:
providing a flexible printed circuit board with a printed lithium ion battery according to claim 1; and
mounting a plurality of active and passive electronic devices on top of copper traces wherein at least one of said active devices is connected to and powered by said printed lithium ion battery.

13. The method according to claim 12 wherein the said active electronic devices are integrated circuits (IC) with different functionalities including one or more of: RF (Radio Frequency) IC, memory chips, logic IC, converter IC, power management IC, application specific IC (ASIC), microcontroller unit (MCU), display driver IC, touch driver IC, touch and display drive integration (TDDI) IC, and biometrics sensor & controller IC.

* * * * *